(12) United States Patent
Dunlavy (10) Patent No.: US 6,814,588 B1
(45) Date of Patent: Nov. 9, 2004

(54) OVERMOLD CABLE TERMINATOR

(75) Inventor: Gary Wayne Dunlavy, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 10/010,512

(22) Filed: Dec. 5, 2001

(51) Int. Cl.$^7$ .............................................. H01R 12/00
(52) U.S. Cl. ........................ 439/67; 439/606; 439/493; 439/76.1
(58) Field of Search ................... 439/67, 77, 492–497, 439/604, 606, 76.1, 874, 876, 936; 174/117 F, 117 FF, 251, 268

(56) References Cited

U.S. PATENT DOCUMENTS

| | | | | |
|---|---|---|---|---|
| 4,018,496 A | * | 4/1977 | Bilsback ....................... | 439/67 |
| 4,403,272 A | * | 9/1983 | Larson et al. ................. | 439/67 |
| 4,526,432 A | * | 7/1985 | Cronin et al. ................. | 439/67 |
| 4,550,357 A | * | 10/1985 | Matsumoto ................. | 174/268 |
| 4,718,861 A | * | 1/1988 | Wood .......................... | 439/460 |
| 4,753,005 A | * | 6/1988 | Hasircoglu .................. | 439/497 |
| 4,871,319 A | * | 10/1989 | Babow ......................... | 439/77 |
| 5,375,041 A | * | 12/1994 | McMahon ................... | 361/749 |
| 5,865,650 A | * | 2/1999 | Marian et al. ............... | 439/638 |
| 5,895,369 A | * | 4/1999 | Flower ......................... | 439/67 |
| 5,951,317 A | * | 9/1999 | Tracy et al. ................. | 439/352 |
| 6,097,613 A | * | 8/2000 | Batten et al. ............... | 361/816 |
| 6,442,027 B2 | * | 8/2002 | Sanada et al. ............... | 361/704 |
| 6,466,447 B2 | * | 10/2002 | Murowaki et al. .......... | 361/752 |
| 6,623,312 B2 | * | 9/2003 | Merry et al. ................. | 439/729 |
| 6,652,312 B2 | * | 11/2003 | Liegl et al. ................. | 439/521 |

* cited by examiner

Primary Examiner—Tho D. Ta
(74) Attorney, Agent, or Firm—Martine & Penilla, LLP (57) ABSTRACT

A cable terminator and method for making the same is provided. The cable terminator includes a printed circuit board with termination circuitry. The cable terminator further includes a ribbon cable with a first end and a second end. The first end is electrically connected to the printed circuit board to enable termination at the first end. An encapsulating mold is provided which encloses the printed circuit board and the first end of the ribbon cable. A method for making the cable terminating circuit board includes connecting the first end of the ribbon cable to the printed circuit board and inserting the printed circuit board and connected first end of the ribbon cable into a mold. The method further includes injecting an encapsulating material into the mold.

14 Claims, 6 Drawing Sheets

OVERMOLD CABLE TERMINATOR

BACKGROUND OF THE INVENTION

1. Field of the Invention

The present invention relates generally to cables and associated terminators, and more particularly to terminators used for Small Computer System Interface (SCSI) buses.

2. Description of the Related Art

In the ever-expanding environment of high technology infrastructure, SCSI architecture remains the performance choice for high-end computer users seeking ways to optimize and maintain high-performance work stations, small business servers, and complex networks alike. Faster peripheral devices, data-intensive applications, and more robust internet connections all require the fastest available data transfer, increased capacity, and better reliability than has been provided with prior art products and systems. The demand has fostered consistent technological advances, and SCSI technology maintains consistent growth and development to meet the demand.

The typical computer work station or network server includes a plurality of peripheral devices connected to the system motherboard across a peripheral component interconnect (PCI) bus. In some applications, a SCSI host adapter connects to the PCI bus to enable the connection of a plurality of peripheral devices such as hard disk drives, optical media recording and play back devices, scanners, Zip™ drives, and the like. Additionally, a SCSI motherboard may be used, enabling the connection of a plurality of peripheral devices, and with the same associated considerations as described above. The increase in speed of processors, the increase in processing speed and efficiency of operating systems, and the increase in clock speed and bandwidth of PCI buses all contribute to the requirement for increased data transfer rate of SCSI peripheral devices.

As is known, a SCSI bus requires termination at both ends of the bus. This termination, generally, provides necessary impedance matching. Without termination, the bus is susceptible to noise and signal corruption caused by electronic pulses reflected from non-terminated ends. In typical configurations, external devices are terminated by either attaching a terminator to the last device in a chain of devices, or by enabling a built-in terminator of the last device in a chain of devices. For internal devices, a terminator is typically attached to the end of a multi-device SCSI device cable.

As SCSI technology evolves to provide for faster and faster data transfer rates, the requirement for termination remains, and is even more critical at the increased clock rates currently being implemented. While external peripheral device configurations typically implement a terminator attached directly to the device, or configure the device with jumpers or DIP switches for termination, internal devices are typically attached to the SCSI host adapter, or SCSI controller, with a ribbon-type SCSI cable having a plurality of connectors that attach to the individual devices. The last connector on the cable is then usually attached to a terminator to terminate the end of the bus. Device cables are usually manufactured to accommodate a typical system configuration of three, five, or seven devices, although any number of devices up to the host adapter capacity is possible. After the internal devices are connected to the plurality of connectors on the device cable, the last connector on the device cable is used to connect to a terminator, also known as a terminator block, to terminate the bus.

Figure 1A:
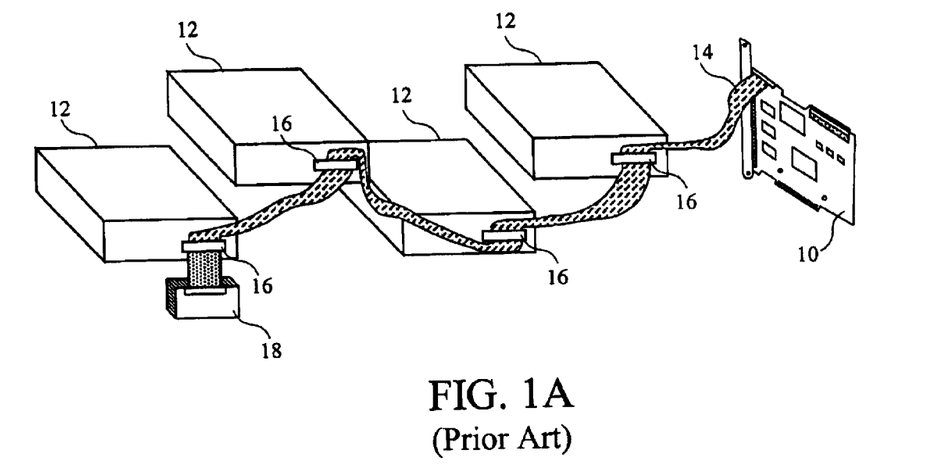
FIG. 1A illustrates a typical connection diagram of internal SCSI peripheral devices.

FIG. 1A illustrates a typical connection diagram of internal SCSI peripheral devices. A SCSI host adapter 10 is shown that connects to a PCI bus (not shown) of a computer system. Exemplary SCSI peripheral devices 12 are shown that would be mounted in a device bay or location within the computer system. A SCSI device cable 14 connects the SCSI peripheral devices 12 to the SCSI host adapter 10. Connectors 16 attach the SCSI device cable 14 to each of the SCSI peripheral devices 12. A terminator 18 is shown at the terminal end of the SCSI device cable 14.

Figure 1B:
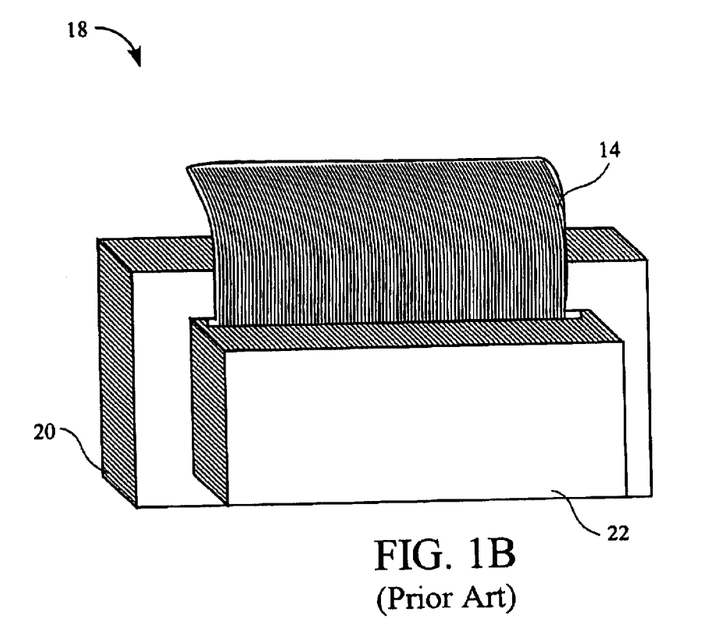
FIG. 1B shows a detailed view of the terminator shown in FIG. 1A.

Following the last device 12 in a chain of devices 12, a last connector 16 is typically used to connect the SCSI device cable 14 to a terminator block, resulting in a terminator 18 as shown in FIG. 1A. FIG. 1B shows a detailed view of the terminator 18 shown in FIG. 1A. In FIG. 1B, SCSI device cable 14 is shown leading to the terminator 18, but connector 16 is not shown. Connector 16 (not shown) is used to connect the SCSI device cable 14 to a terminator block 20 in the same manner as connectors 16 attach SCSI device cable 14 to SCSI peripheral devices 12, typically using pins and holes or other similar quick connect methods. Connection cover 22 is typically fitted over the connector (not shown) to cover the point of connection preventing inadvertent contact with any points of connection, accumulation of dust or other debris, and generally protecting the SCSI device cable 14, the connector (not shown), and the terminator block 20. The resulting unit including the SCSI device cable 14, the terminator block 20, and the connection cover 22, is collectively referred to as the terminator 18.

Figure 1C:
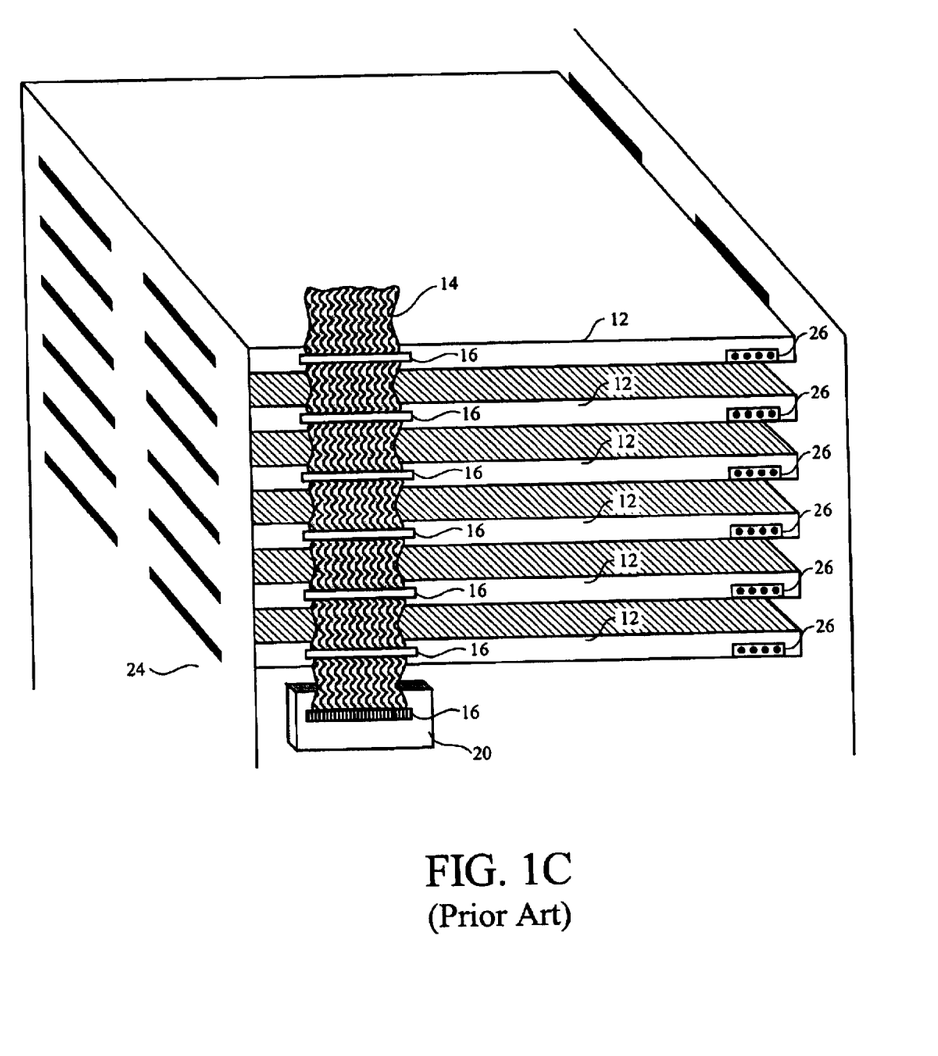
FIG. 1C shows an exemplary internal SCSI peripheral device configuration.

This prior art terminator 18 used for terminating one or more internal SCSI peripheral devices 12, effectively terminates the end of the SCSI bus, but is deficient for a number of reasons, some of which are herein discussed. As technological advances in SCSI design have provided for increasing numbers of SCSI peripheral devices 12 to be connected to a single SCSI host adapter 10 (see FIG. 1A), space and airflow have become increasingly important considerations for computer system configuration. FIG. 1C shows an exemplary internal SCSI peripheral device 12 configuration. A typical drive bay 24 is shown with six representative SCSI peripheral devices 12. The SCSI peripheral devices 12 could be hard disk drives, CD-R drives, other optical media drives, Zip™ drives, and the like. A typical SCSI host adapter 10 (see FIG. 1A) accommodates more than six internal SCSI peripheral devices 12, and therefore FIG. 1C illustrates space and airflow requirements for less than the maximum number of devices that might be connected to a single host adapter 10. SCSI peripheral devices 12 are typically installed in drive bay 24 as shown, and connected to a SCSI host adapter 10 (see FIG. 1A) with SCSI device cable 14. In addition to SCSI device cable 14, power is supplied to each SCSI peripheral device 12 at power connection 26. FIG. 1C does not show power cabling, but it should be appreciated the additional cabling presents further space management difficulty, and further restricts airflow through and around SCSI peripheral devices 12.

Terminator block 20 is shown connected to a last connector 16 of SCSI device cable 14. Terminator block 20 is shown without connection cover 22 (see FIG. 1B). A common problem with prior art terminators 18 (FIGS. 1A and 1B) is that connection cover 22 (FIG. 1B) often becomes detached from terminator block 20. The detached connection cover 22 presents a potential source of foreign object damage if it should fall into the computer system against other devices, connections, wires, and the like. Additionally, a detached connection cover 22 can also restrict airflow in already compact spaces which can damage individual devices or degrade system performance due to accumulated heat. Further, the exposed connections at connector 16 attached to the terminator block 20 present a potential source of electrical short or equipment damage if the area of connection is forced against a metal case, a metal exterior of another device, or alongside cabling or wire connections.

It should be further appreciated from FIGS. 1A, 1B, and 1C that terminator 18 has a length, a width, and a depth. Although the terminator 18 is connected to essentially the end of a SCSI device cable 14, it requires space near the last SCSI peripheral device 12 in the plurality of SCSI devices that are connected to the SCSI host adapter 10 (See FIG. 1A) with SCSI device cable 14. As mentioned above, this can result in the terminator 18 being forced in between devices, along side system cards, devices, cabling, and the like, all presenting a potential source of equipment damage, and even operator injury in the case of an electrical short. The size of the terminator 18 further restricts necessary airflow within the already compact and densely filled space of a computer system case or cabinet.

Forcing a terminator 18 into a compact and densely filled space of a computer system case or cabinet can put stress on the individual wire connections at connector 16. Unlike the connectors 16 connected to SCSI peripheral devices 12 which are fixed in place within drive bay 24, the terminator 18 (FIGS. 1A and 1B) is moved into any number of positions and orientations in order to get it to fit within drive bay 24 and system. The positioning and orientation of terminator 18 can put varying stresses on the individual wire connections of connector 16 attached to terminator block 20 resulting in a potential source of incomplete or broken connections, inoperable equipment, and electrical shock.

What is needed is a terminator for a SCSI bus that can be used with internal SCSI devices that effectively terminates the SCSI bus while presenting a minimum size and space requirement, provides sturdy and durable connections for the wires of a SCSI device cable, and is light and aerodynamically designed to minimize airflow restriction. The terminator should not present a risk of foreign object damage within a computer system case or cabinet, and should be compatible with existing and developing SCSI technology.

SUMMARY OF THE INVENTION

Broadly speaking, the present invention fills these needs by providing an inventive overmold cable terminator and method for making the same. The present invention can be implemented in numerous ways, including as an apparatus, a process, a device, or a method. Several embodiments of the present invention are described below.

In one embodiment, a cable terminator is disclosed. The cable terminator includes a printed circuit board which has termination circuitry. The cable terminator further includes a ribbon cable with a first end and a second end. The first end of the ribbon cable is electrically connected to the printed circuit board to enable termination at the first end of the ribbon cable. An encapsulating mold encloses the printed circuit board and first end of the ribbon cable.

In another embodiment, a SCSI cable with an integrated terminator is disclosed. The SCSI cable with an integrated terminator includes a ribbon cable with a first end, a second end, and at least one device connector between the first end and the second end. The SCSI cable with an integrated terminator further includes a printed circuit board with termination circuitry. The termination circuitry is electrically coupled to the first end of the SCSI cable. An overmold is included which seals the printed circuit board and the first end of the SCSI cable. The overmold retains a single output path for the SCSI cable that extends to the second end.

In still a further embodiment, a method for making a ribbon cable with an integrated terminator is disclosed. The method includes providing a terminating circuit board and connecting an end of a ribbon cable to the terminating circuit board. The terminating circuit board with the end of the ribbon cable is inserted into a mold. The method further includes injecting an encapsulating material into the mold.

The advantages of the present invention are numerous. One notable benefit and advantage of the invention is the size. Smaller and much thinner than prior art, the present invention maintains a maximum achievable airflow in and around the plurality of components within the computer system case or cabinet. The slim profile of the present invention is aerodynamic to minimize airflow restriction within the system in which the present invention is implemented, and further, does not impede access to adjacent cards, components, connections, and the like.

Another benefit is the single-component construction of the present invention. Unlike prior art, the present invention has no detachable parts that can become dislodged to present a potential for foreign object damage to adjacent devices, components, and wiring of a computer system.

An additional benefit is the ease of manufacture of the present invention. A method of the present invention utilizes known processes implemented in other aspects of device and system production, and presents a simple, compatible method of manufacture for ease of implementation in prior and developing art.

Yet another benefit is the robust functionality of the present invention. The inventive terminator utilizes fixed connections that are then protected from stresses or exposure to potential sources of damage, electrical short, and the like.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a single-component, overmold cable terminator is disclosed. The single-component overmold cable terminator is fabricated to a single- or multiple-device connector cable. Examples of device connector cables include SCSI, Wide SCSI, Ultra Wide SCSI, Ultra2 Wide SCSI, low voltage differential (LVD) SCSI device connector cables and the like. As used herein, the term "cable terminator" is used to describe a cable terminator used to terminate a ribbon or other suitable cable used to connect one or more SCSI, one or more LVD SCSI, or one or more similar devices to a SCSI host adapter, a motherboard having a SCSI chip, or a device such as a coupler, extender, or other connector connected to a SCSI host adapter or motherboard having a SCSI chip. In preferred embodiments, the overmold cable terminator includes an integrated ribbon cable and bus terminator having a printed circuit board with termination circuitry and a ribbon cable electrically connected to the printed circuit board to enable termination. The printed circuit board and connected ribbon cable are sealed in an encapsulating mold.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
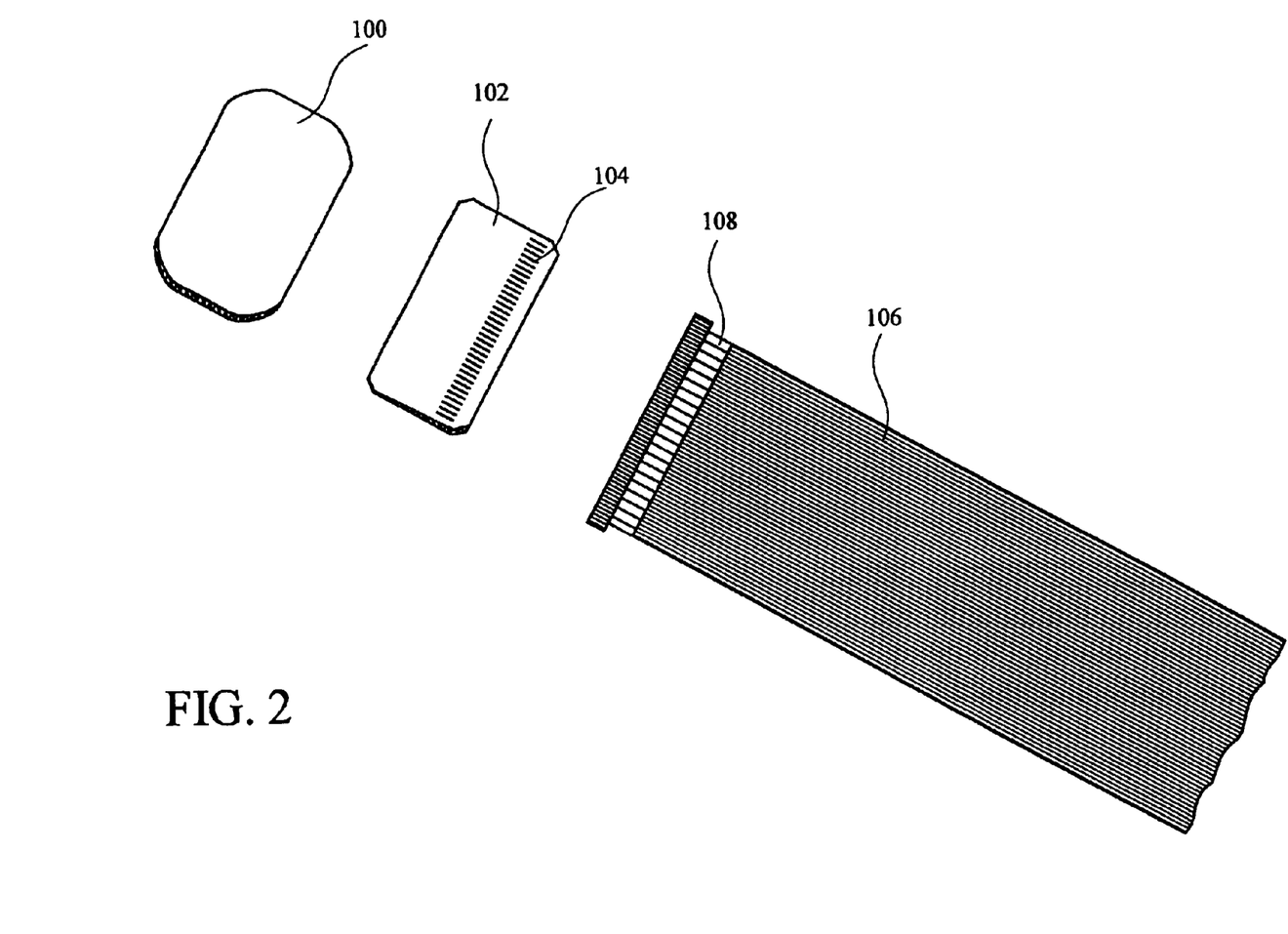
FIG. 2 shows components of an overmold cable terminator in accordance with one embodiment of the present invention.

FIG. 2 shows an exploded view of components of an overmold cable terminator in accordance with one embodiment of the present invention. As will be described in greater detail below, one embodiment of the present invention is a single-component overmold cable terminator. In FIG. 2, the single component has been separated into distinct subcomponents for ease of illustration and discussion.

As illustrated in FIG. 2, one embodiment of an overmold cable terminator includes a SCSI connector cable 106 suitable for use with LVD devices, a terminating printed circuit board (PCB) 102, and an overmold 100. An overmold 100 is generally an encapsulating cover formed around the terminating PCB 102 which is joined with a SCSI cable 106.

In one embodiment of the present invention, the SCSI connector cable 106 is a ribbon cable including a plurality of individual connecting wires suitable for use in the connection of a plurality of LVD SCSI peripheral devices. In one embodiment, the SCSI connector cable 106 is of a type typically used to connect a plurality of internal SCSI LVD devices to a SCSI host adapter 10 (see FIG. 1A), and includes thirty-four cable pairs. A connection strip 108 is fabricated, in one embodiment, in the SCSI connector cable 106 to provide for the connection of the SCSI connector cable 106 to the terminating PCB 102. An exemplary connection strip 108 is a section of the SCSI connector cable 106, where the protective covering, also called insulation, is removed from each of the individual wires that make up the SCSI connector cable 106. As illustrated in FIG. 2, the resulting connection strip 108 is a section of bare wire across the width of the SCSI connector cable 106, and the length of the stripped portion of wire is of sufficient length for connecting to the terminating PCB 102 at pin connectors 104. In one embodiment, the sixty-eight wires of the thirty-four cable pairs are configured to be immediately adjacent to one another without braiding or intertwining at the connection strip 108, and have a pitch or wire separation of approximately 0.025 inches.

The terminating PCB 102 is a typical PCB fabricated with electrical circuitry for terminating a SCSI, an LVD SCSI, or other similar circuit. In one embodiment, the terminating PCB 102 is electrically passive, and is fabricated for the termination of a circuit without configuration for the application of electrical power to the terminating PCB 102.

In one embodiment of the invention, the terminating PCB 102 is fabricated to range from approximately ½" to 1½" in length, 1½" to 2½" in width, and 1/32" to ⅛" in depth, and one embodiment being about 1" long, 2" wide, and 1/16" deep. In another embodiment, the width of the terminating PCB 102 approximates the width of the ribbon cable to which the terminating PCB 102 will be connected. The terminating PCB 102 is fabricated using known PCB fabrication methods, techniques, and materials.

In one embodiment, the terminating PCB 102 includes a row of pin connectors 104 used to connect the SCSI connector cable 106 to the terminating PCB 102. Pin connectors 104 are configured to provide connection points for the individual wires of the SCSI connector cable 106. In one embodiment, the SCSI connector cable 106 is joined with the terminating PCB 104 by connecting the individual wires of the SCSI connector cable 106 that are stripped of insulation or other protective coating at the connection strip 108 to the terminating PCB 102 at the pin connectors 104. In one embodiment, the terminating PCB is fabricated for use with a SCSI LVD device cable 106 having 34 cable pairs. In this embodiment, the pin connectors 104 include sixty-eight pins for connection of the bare or exposed wire at the connection strip 108 to the terminating PCB 102. Pin connectors 104 would therefore be fabricated to 0.025" pitch, and the corresponding individual wires at the connection strip 108 of the SCSI cable 106 are soldered or otherwise suitably affixed to the pin connectors 104 to provide an electrical path to a terminating circuit fabricated in the terminating PCB 102.

An overmold 100 is fabricated over and around the terminating PCB 102 to which the SCSI connector cable 106 is attached. In one embodiment, the overmold 100 is only slightly larger than the terminating PCB 102 which it encapsulates. The size of the overmold 100 is generally approximated by the size of the terminating PCB 102 plus minimally sufficient dimension to provide for protection and complete coverage of the terminating PCB 102. In one embodiment, the outer dimension of an overmold which encapsulates a terminating PCB 102 and SCSI connector cable 106 attached thereto is approximately 1 7/16" in length, 2 ⅜" in width, and 3/16" in depth. The size of the overmold 100 will vary with the size of the terminating PCB 102 it is fabricated to cover, and with any additional ornamentation or added utility fabricated therein. By way of example, an overmold 100 can be fabricated with prongs, fins, latches, or other similar protuberance in order to attach the terminal end of the SCSI connector cable 106 with terminating overmold 100 to a SCSI peripheral device, a computer case, a device rack, or other similar adjacent surface to which the overmold 100 can be attached. Additionally, an overmold 100 can be fabricated with an ornamental design, corporate logo, or other identifying mark or surface that can add to the overall final exterior dimension.

Figure 3A:
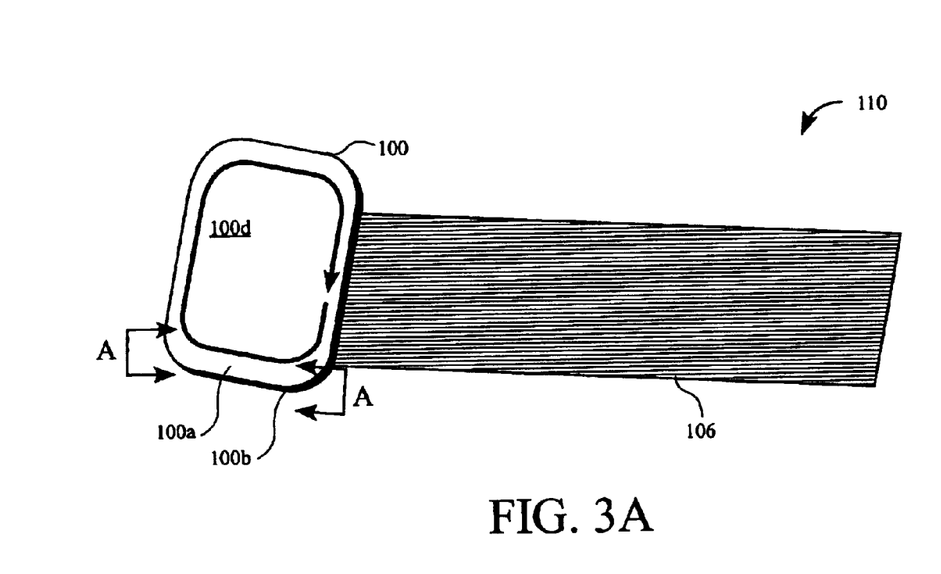
FIG. 3A shows an overmold cable terminator in accordance with one embodiment of the present invention.

FIG. 3A shows an overmold cable terminator 110 in accordance with one embodiment of the present invention. In an embodiment as illustrated in FIG. 3A, overmold 100 is shown fabricated over a terminating PCB 102 (not visible) with a ribbon connector cable 106 shown extending therefrom. Overmold 100 covers and protects the exposed wire at the connection strip 108 (not visible) connected to pin connectors 104 (not visible) on terminating PCB 102 (not visible). A top surface 100d of overmold 100 can be fabricated with an ornamental design, a corporate logo, or other surface type or imprint as desired The illustrated embodiment of the overmold cable terminator 110 presents a slim and aerodynamic profile, protects the terminating connections, and effectively terminates a SCSI circuit ensuring a properly terminated SCSI bus for any SCSI or SCSI LVD device connected to and with the ribbon cable 106.

Figure 3B:
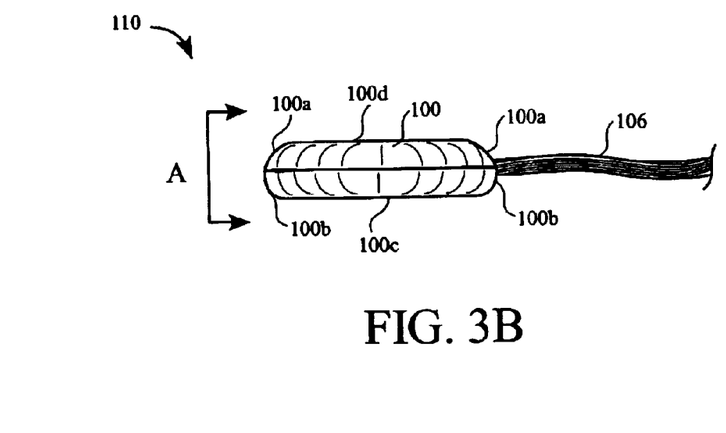
FIG. 3B shows a side or cross-section view of the overmold cable terminator shown in FIG. 3A.

FIG. 3B shows a side or cross-section view of the overmold cable terminator 110 shown in FIG. 3A. The slim and aerodynamic profile of the overmold cable terminator 110 is emphasized in the cross-sectional view of FIG. 3B. In one embodiment, the overmold 100 is fabricated to include a top surface 100d, a bottom surface 100c, a tapered edge 100a adjacent to the top surface 100d, and a rounded edge 100b adjacent to the bottom surface 100c. Ribbon cable 106 extends out of overmold 100 along a width of the overmold 100 in a region including a portion of the tapered edge 100a and a portion of the rounded edge 100b.

Figure 4:
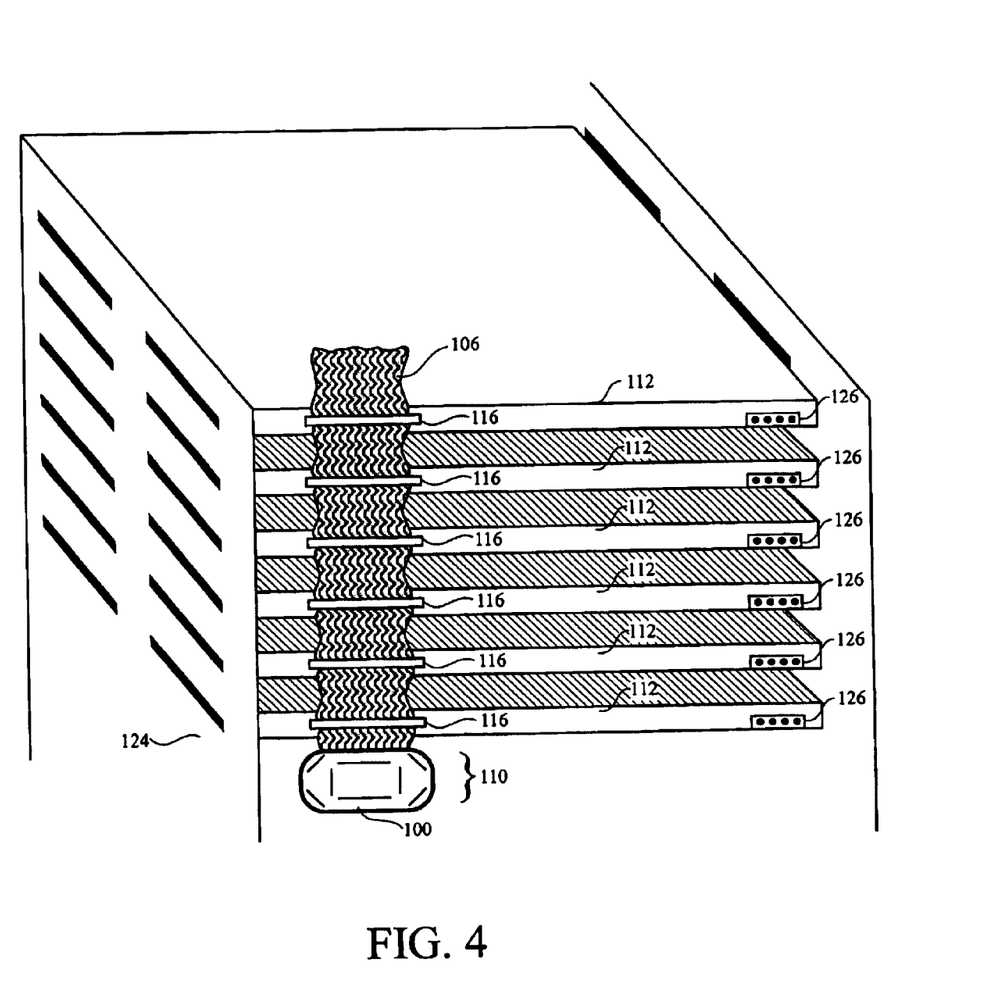
FIG. 4 illustrates an exemplary internal SCSI peripheral device configuration having a plurality of SCSI devices in accordance with an embodiment of the invention.

FIG. 4 illustrates an exemplary internal SCSI peripheral device configuration having a plurality of SCSI LVD devices 112 in accordance with an embodiment of the invention. A typical computer system drive bay 124 is shown configured with six representative SCSI LVD peripheral devices 112. The SCSI LVD peripheral devices 112 could be hard disk drives, CD-R drives, other optical media drives, Zip™ drives, and the like. As described above in reference to FIG. 1C, a typical SCSI host adapter 10 (see FIG. 1A) accommodates more than six internal SCSI peripheral devices 112. FIG. 4 and FIG. 1C therefore illustrate space and airflow requirements for less than the maximum number of devices that might be connected to a single host adapter 10.

In addition to SCSI bus connection provided through terminating connector cable 106, power is supplied to each SCSI LVD peripheral device 112 at power connection 126. FIG. 4, like FIG. 1C above, does not show power cabling, but it should be appreciated the additional cabling presents further space management difficulty, and further restricts airflow through and around SCSI LVD peripheral devices 112.

Overmold cable terminator 110 is shown identified at the terminal end of ribbon cable 106. Overmold 100 presents a slim and aerodynamic profile that minimizes airflow restriction within computer system drive bay 124. Further, the terminating PCB (not visible) is effectively protected, as are the electrical connections between ribbon cable 106 and terminating PCB (not visible) which terminate the SCSI bus. Because the ribbon cable 106 is connected directly to the terminating PCB (not visible), the SCSI bus is terminated without having to connect a terminator to a last device connector 116 on ribbon cable 106 (See FIGS. 1A, 1C). There is also no requirement for a connection cover (see FIG. 1B) to protect the points of connection. It can be appreciated in FIG. 4 that the present invention provides a smaller, slimmer, and more robust termination of the SCSI bus than has been provided by prior art devices. One embodiment of the present invention provides enhanced signal integrity, eliminates sources of potential foreign object damage, and is easily implemented in and configured for specific applications.

Figure 5:
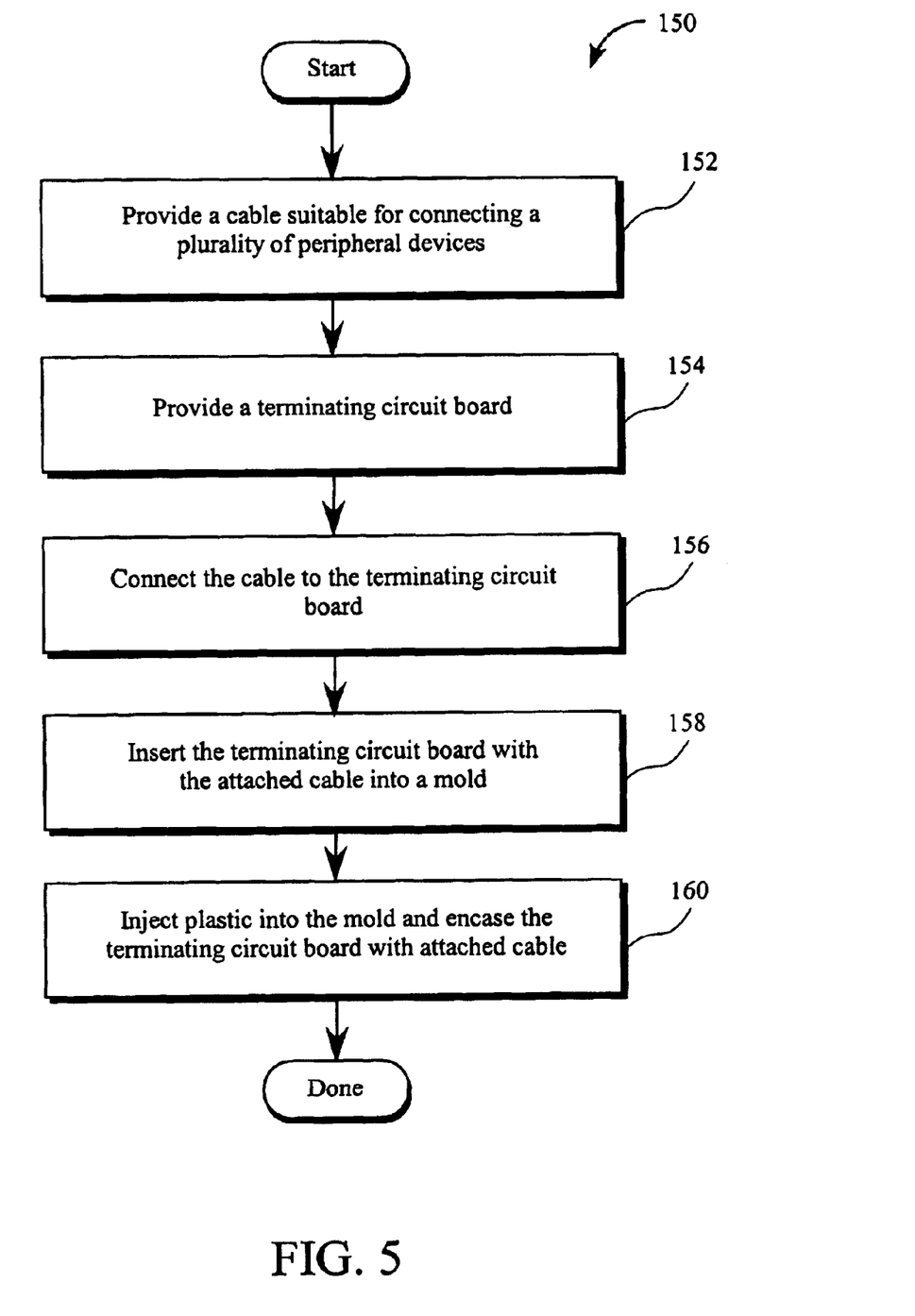
FIG. 5 shows a flow chart diagram illustrating the method operations performed in fabricating an overmold cable terminator in accordance with one embodiment of the present invention.

FIG. 5 shows a flow chart diagram 150 illustrating the method operations performed in fabricating an overmold cable terminator in accordance with one embodiment of the present invention. The method begins with operation 152 in which a cable is provided that is suitable for connecting a plurality of peripheral devices. Examples of peripheral devices include SCSI devices, SCSI LVD devices, and the like. In one embodiment, the cable is a thirty-four pair cable providing sixty-eight conductors for connecting a plurality of SCSI LVD devices. The plurality of SCSI LVD devices include typical configurations of three, five, and seven devices, as well as customized configurations for any number of devices as desired.

The method continues with operation 154 in which a terminating circuit board is provided. In one embodiment, the terminating circuit board is known as a terminating printed circuit board, or PCB, and is a typical electronic circuit board fabricated with the electrical circuitry for the termination of a SCSI bus. In one embodiment, the terminating circuit board includes sixty-eight pin connectors suitable for enabling termination of SCSI LVD devices. Other embodiments of the terminating circuit board are fabricated with more or less pin connectors to accommodate specific device requirements and specifications.

Continuing to operation 156, the method provides for connecting the cable to the terminating circuit board. In one embodiment, a thirty-four pair cable providing sixty-eight conductors is utilized. At approximately the terminal end of the cable, the individual wires are arranged adjacent to one another without braiding or intertwining. The insulation or protective covering is stripped to a length of approximately the length of the pin connectors on the terminating PCB across the width of the cable, resulting in aligned bare wire having a pitch of approximately 0.025". It should be appreciated that the number of individual conducting wires and cable pairs varies in alternative embodiments in accordance with the device types, requirements, and specifications. The resulting pitch will vary accordingly. The stripping is accomplished by known wire stripping techniques including burning, searing, or otherwise stripping with heat, light, laser, and the like for precise control.

In one embodiment, the cable is attached to the terminating circuit board by connecting the individual bare conducting wires of the cable to the pin connectors of the terminating circuit board, making an electrically sound connection. In one embodiment, the connections are fixed by soldering.

The method next continues with operation 158 in which the terminating circuit board with the attached cable is inserted into a mold, also know as a forming mold. In one embodiment, the mold is fabricated to create an overmold of a size only slightly larger than the terminating circuit board. As described above in reference to FIG. 3A, one embodiment of the terminating circuit board has a width that approximates the width of the cable. The resulting overmold is created to cover and protect the terminating circuit board and the connections between the pin connectors and individual conducting wires. Additional features are created, in some embodiments, to include formation of a corporate logo, ornamental design, and the like on one or both faces of the overmold. In one embodiment, the space and airflow restrictions within a computer system drive bay dictate a slim and aerodynamic profile for the overmold, and the mold is provided to create the smallest overmold with the thinnest profile that will adequately and sufficiently cover and protect the encapsulated terminating circuit board and attached cable.

The method concludes with operation 160 in which plastic is injected into the forming mold. In one embodiment, ABS plastic is used to provide adequate insulation, protection, adhesion, and form in a light weight, rigid and durable material. Other embodiments utilize rubber, rubberized plastic or similar materials. Once the plastic, or other material used to form the overmold, has been injected into the mold, the method is done.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A cable terminator, comprising:
   a printed circuit board having SCSI termination circuitry;
   a ribbon cable having a first end and a second end, the first end being electrically connected to the printed circuit board to enable SCSI termination at the first end, the first end including a connection strip being defined by a portion of bare wire at the first end, the bare wire connecting to pin connectors of the printed circuit board; and
   an encapsulating overmold being defined from a single component material, the encapsulating overmold enclosing the printed circuit board and the first end of the ribbon cable.

2. A cable terminator as recited in claim 1, wherein the ribbon cable is a SCSI cable.

3. A cable terminator as recited in claim 1, wherein the ribbon cable is a LVD cable.

4. A cable terminator as recited in claim 1, wherein the printed circuit board is electrically passive.

5. A cable terminator as recited in claim 1, wherein the printed circuit board has a board width that approximates a ribbon width of the ribbon cable.

6. A cable terminator as recited in claim 1, wherein the second end of the ribbon cable connects to one of a host adapter card, a motherboard, and a device.

7. A cable terminator as recited in claim 1, wherein peripheral devices are connected to the ribbon cable, and wherein the second end of the ribbon cable connects to a SCSI controller.

8. A cable terminator as recited in claim 1, wherein the encapsulating overmold is a rigid material, and wherein the rigid material is rubberized plastic.

9. A cable terminator as recited in claim 1, wherein the encapsulating overmold is configured to cover the electrical connection between the first end of the ribbon cable and the printed circuit board.

10. A SCSI cable having an integrated terminator, comprising:
    a ribbon cable having a first end, a second end, and at least one device connector between the first end and the second end;
    a printed circuit board having SCSI termination circuitry, the SCSI termination circuitry being electrically coupled to the first end of the SCSI cable; and
    an overmold being defined from a single component material, the overmold sealing the printed circuit board and the first end of the SCSI cable, the overmold retaining a single output path for the SCSI cable that extends to the second end.

11. A SCSI cable having an integrated terminator as recited in claim 10, wherein the printed circuit board is electrically passive.

12. A SCSI cable having an integrated terminator as recited in claim 10, wherein the second end of the SCSI cable connects to one of a host adapter card, a motherboard, and a device.

13. A SCSI cable having an integrated terminator as recited in claim 10, wherein the overmold is a rigid material and wherein the rigid material is rubberized plastic.

14. A SCSI cable having an integrated terminator as recited in claim 10, wherein the overmold is configured to provide a slim and aerodynamic profile to the sealed printed circuit board and first end of the SCSI cable.

* * * * *